(12) United States Patent
Kirillov et al.

(10) Patent No.: US 12,235,439 B2
(45) Date of Patent: Feb. 25, 2025

(54) MEMS MIRROR SYSTEM WITH SLOW LIGHT BEAM DEFLECTION USING FAST RESONANT OSCILLATIONS ABOUT AT LEAST TWO RESONANT AXES

(71) Applicant: Infineon Technologies AG, Neubiberg (DE)

(72) Inventors: Boris Kirillov, Judendorf-Straßenge (AT); Maksym Sladkov, Graz (AT)

(73) Assignee: Infineon Technologies AG, Neubiberg (DE)

( * ) Notice: Subject to any disclaimer, the term of this patent is extended or adjusted under 35 U.S.C. 154(b) by 771 days.

(21) Appl. No.: 17/412,708

(22) Filed: Aug. 26, 2021

(65) Prior Publication Data
US 2023/0067823 A1   Mar. 2, 2023

(51) Int. Cl.
| | | |
|---|---|---|
| *G02B 26/08* | (2006.01) | |
| *B81B 7/00* | (2006.01) | |
| *G01S 7/481* | (2006.01) | |
| *G01S 17/34* | (2020.01) | |

(52) U.S. Cl.
CPC .......... *G02B 26/0833* (2013.01); *B81B 7/008* (2013.01); *G01S 7/4817* (2013.01); *B81B 2201/047* (2013.01); *G01S 17/34* (2020.01)

(58) Field of Classification Search
CPC   G02B 26/0833; G02B 26/101; G02B 26/105; B81B 7/008; B81B 2201/047; G01S 7/4817; G01S 17/34
See application file for complete search history.

(56) References Cited

U.S. PATENT DOCUMENTS

| | | | | |
|---|---|---|---|---|
| 2008/0239445 A1* | 10/2008 | Ando | ................... | G02B 26/105 |
| | | | | 359/224.1 |
| 2020/0292672 A1* | 9/2020 | Wang | ................... | G02B 26/101 |

* cited by examiner

*Primary Examiner* — Euncha P Cherry
(74) *Attorney, Agent, or Firm* — Harrity & Harrity, LLP

(57) ABSTRACT

A light beam deflection system is configured to transmit a light beam at an output deflection angle that changes over time. The system includes a first resonant structure configured to oscillate about a first rotation axis at first resonant frequency; a second resonant structure configured to oscillate about a second rotation axis at a second resonant frequency, where the first rotation axis is parallel to the second rotation axis, and where the first resonant frequency and the second resonant frequency are different and define a predetermined frequency difference; and a driver circuit configured to generate a first driving signal to drive the first resonant structure while further generating a second driving signal to drive the second resonant structure such that the output deflection angle of the light beam oscillates according to a beat pattern of a beat wave whose extrema amplitudes are modulated and defined by a periodic envelope.

31 Claims, 7 Drawing Sheets

MEMS MIRROR SYSTEM WITH SLOW LIGHT BEAM DEFLECTION USING FAST RESONANT OSCILLATIONS ABOUT AT LEAST TWO RESONANT AXES

BACKGROUND

Light beam deflection implemented with the microelectromechanical system (MEMS) mirrors is enabling many applications including but not limited to Light Detection and Ranging (LIDAR), pico-projector displays, cameras (visual, hyperspectral, or thermal), spectrometers, laser material processing, and many others. The angular velocity of the beam deflection (i.e., the rate of angular change) is critical in some of the applications where the measurement time is long and cannot be compromised. Frequency-modulated continuous-wave (FMCW) LIDAR is one example that requires relatively slow beam deflection velocity. In FWCW applications, a light beam is transmitted as a continuous wave as opposed to, for example, discrete light pulses, while one or more MEMS mirrors continuously move (i.e., oscillates) to perform beam steering. Thus, the continuous wave is continuously being steered.

Slow beam deflection implemented with MEMS mirror typically means either operating the MEMS mirror at a low resonant frequency or in a quasi-static operation. Both options have their disadvantages. Low frequency MEMS mirrors are susceptible to shock and vibration and also results in a lower resolution compared to a fast resonant MEMS mirror. A quasi-static mirror could be also susceptible to shock and vibration if its eigenfrequency is low and also results in a lower resolution compared to a fast resonant MEMS mirror. Or quasi-static mirror's design could require large actuation structures to provide enough force to move the mirror implemented on the stiff suspension to achieve high eigenfrequency. However, increasing the size of the actuation structures is not desirable since it adds bulk to the MEMS mirror device.

Therefore, an improved system and method that is capable of providing slow beam deflection with one or more fast resonant operated MEMS mirrors may be desirable.

SUMMARY

One or more embodiments provide a light beam deflection system configured to transmit a light beam at an output deflection angle that changes over time The light beam deflection system includes: a first resonant structure configured to oscillate about a first rotation axis at first resonant frequency; a second resonant structure configured to oscillate about a second rotation axis at a second resonant frequency; wherein the first rotation axis is parallel to the second rotation axis, wherein the first resonant frequency and the second resonant frequency are different and define a predetermined frequency difference; and a driver circuit configured to generate a first driving signal to drive the first resonant structure about the first rotation axis at the first resonant frequency while further generating a second driving signal to drive the second resonant structure about the second rotation axis at the second resonant frequency such that the output deflection angle of the light beam oscillates according to a beat pattern of a beat wave whose extrema amplitudes are modulated and defined by a periodic envelope.

One or more embodiments provide a light beam deflection system configured to transmit a light beam at an output deflection angle that changes over time. The light beam deflection system includes a microelectromechanical system (MEMS) device and a driver circuit. The MEMS device includes: an outer rotationally fixed frame; an inner oscillating frame that is suspended from the outer rotationally fixed frame, wherein the inner oscillating frame is a resonant structure configured to oscillate about a first rotation axis at first resonant frequency relative to the outer rotationally fixed frame; and a resonant mirror that is suspended from the inner oscillating frame, wherein the resonant mirror is configured to oscillate about a second rotation axis at second resonant frequency relative to the inner oscillating frame, wherein the first rotation axis is co-incident with the second rotation axis, and wherein the first resonant frequency and the second resonant frequency are different and define a predetermined frequency difference. The driver circuit is configured to generate a first driving signal to drive the inner oscillating frame about the first rotation axis at the first resonant frequency while further generating a second driving signal to drive the resonant mirror about the second rotation axis at the second resonant frequency such that the output deflection angle of the light beam oscillates according to a beat pattern of a beat wave whose extrema amplitudes are modulated and defined by a periodic envelope.

BRIEF DESCRIPTION OF THE DRAWINGS

Embodiments are described herein making reference to the appended drawings.

DETAILED DESCRIPTION

Figure 1A:
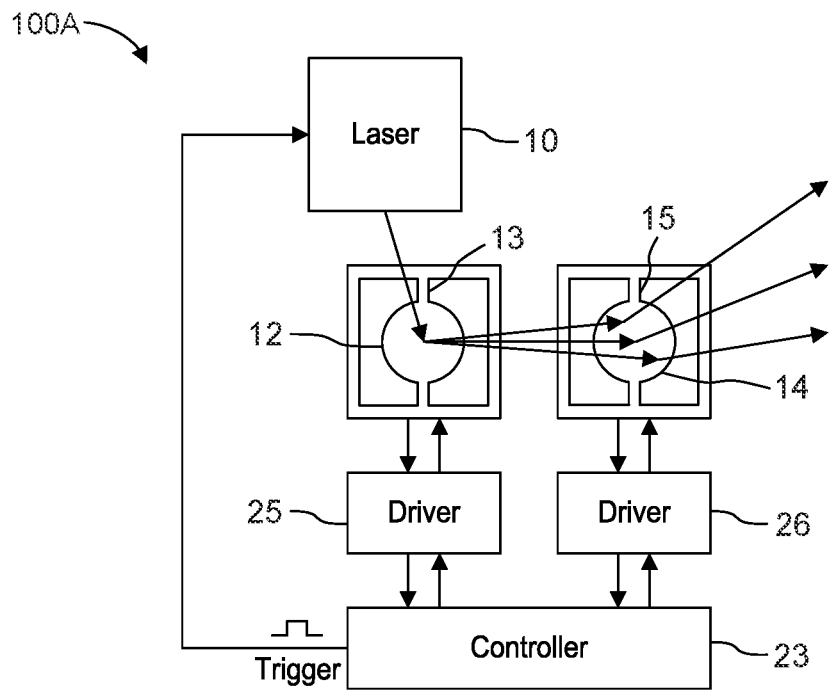
FIGS. 1A and 1B are a schematic block diagrams of resonant MEMS mirror scanning systems according to one or more embodiments.

In the following, various embodiments will be described in detail referring to the attached drawings. It should be noted that these embodiments serve illustrative purposes only and are not to be construed as limiting. For example, while embodiments may be described as comprising a plurality of features or elements, this is not to be construed as indicating that all these features or elements are needed for implementing embodiments. Instead, in other embodiments, some of the features or elements may be omitted, or may be replaced by alternative features or elements. Additionally, further features or elements in addition to the ones explicitly shown and described may be provided, for example conventional components of sensor devices.

Features from different embodiments may be combined to form further embodiments, unless specifically noted otherwise. Variations or modifications described with respect to one of the embodiments may also be applicable to other embodiments. In some instances, well-known structures and devices are shown in block diagram form rather than in detail in order to avoid obscuring the embodiments.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

Connections or couplings between elements shown in the drawings or described herein may be wire-based connections or wireless connections unless noted otherwise. Furthermore, such connections or couplings may be direct connections or couplings without additional intervening elements or indirect connections or couplings with one or more additional intervening elements, as long as the general purpose of the connection or coupling, for example to transmit a certain kind of signal or to transmit a certain kind of information, is essentially maintained.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

Embodiments relate to optical transmitters and optical transmitter systems configured to transmit continuous wave light beams (e.g., FMCW light beams) according to a scanning pattern or steering pattern. Light beams include visible light, infrared (IR) light, or other type of illumination signals. In some applications, the transmitted light may be backscattered by an object back towards the system where the backscattered light is detected by a sensor. The sensor may convert the received backscattered light into an electric signal, for example a current signal or a voltage signal, that may be further processed by the system to generate object data and/or an image.

For example, in Light Detection and Ranging (LIDAR) systems, a light source transmits a light beam into a field of view and the light reflects from one or more objects by backscattering. For continuous wave modulation, such as that used for a frequency-modulated continuous-wave (FMCW) beam, a detected wave after reflection has a shifted frequency and/or phase relative to the transmitted beam, and the shift is proportional to distance from reflecting object or surface. Thus, the distance can be determined from the measured shift. This is in contrast to pulsed modulation, in which a system measures distance to a 3D object by measuring the absolute time a light pulse takes to travel from a source into the 3D scene and back, after reflection.

A pixel array may be used to detect and measure the reflected beam. For example, an array of photodetectors receives reflections from objects illuminated by the light and signal processing circuitry measures the frequency shift or phase shift based on the detected reflections. Differences in frequency shifts or phase shifts across multiple pixels of the pixel array can then be used to make digital 3D representations of an environment or to generate other sensor data.

A scan can illuminate a scene in a continuous scan fashion. By emitting the light beam in different scanning directions, an area referred to as the field of view can be scanned and objects within the area can be detected and imaged. Thus, the field of view represents a scanning plane having a center of projection.

Figure 1B:
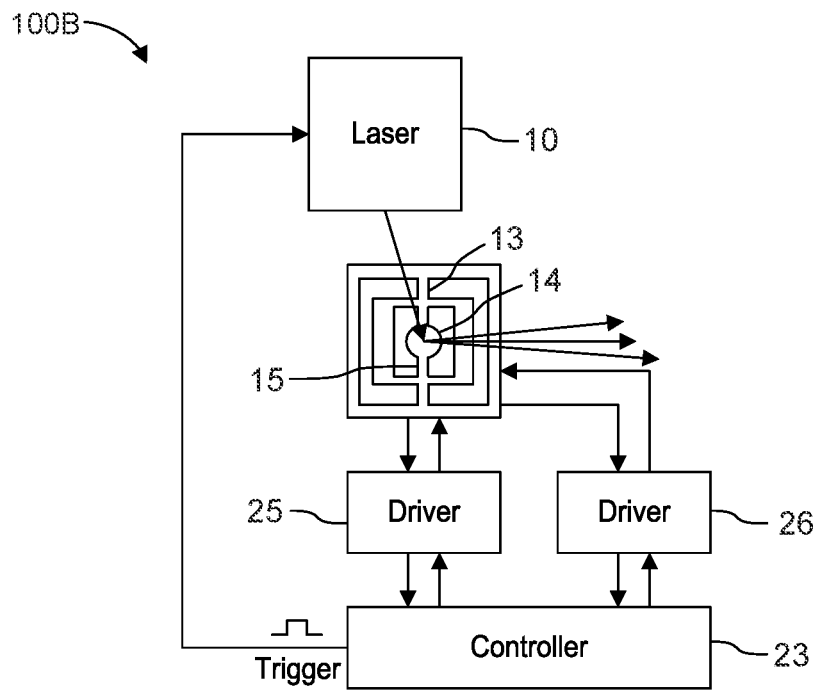

FIGS. 1A and 1B are a schematic block diagrams of fast resonant MEMS mirror scanning systems 100A and 100B, respectively, according to one or more embodiments.

In particular, the scanning system 100A includes two one-dimensional (1D) resonant MEMS mirrors 12 and 14 that are used to steer or otherwise deflect light beams according to a continuous scanning pattern. In one or more embodiments described herein, the MEMS mirrors 12 and 14 oscillate about their respective axis, with the axes being arranged parallel to each other. Thus, two or more resonant MEMS mirrors oscillating around optically coupled or closely arranged parallel axes may be used for beam steering and, specifically, for transmitting a light beam at an output deflection angle that changes over time. For example, the output deflection angle may be defined by a maximum positive angle (e.g., +15°) and a maximum negative angle (e.g., −15°, whereby the output deflection angle of the light beam oscillates between those two extrema.

In this case, one MEMS mirror is configured to oscillate at a first resonant frequency f1 and the other MEMS mirror is configured to oscillate at a second resonant frequency f2 that is different from the first resonant frequency f1. The two MEMS mirrors 12 and 14 form a beam deflection system that produce a slow moving angular beam trajectory (i.e., a slow angular rate of change) during certain "slow moving" periods or intervals of the output deflection angle scanning pattern. A "angular rate of change" that is "slow" is one that is below a predetermined threshold.

The angular beam trajectory (i.e., the output deflection angle) produced with the two fast resonant MEMS mirrors 12 and 14 being driven at different resonant frequencies about parallel rotation axes comprises a slowly moving envelop oscillating at a beat frequency and fast moving oscillation trajectory under the envelope. The intervals of slow motion (along the envelop) can be used for measurements where the slow motion is required (like FMCW LIDAR).

In contrast, the scanning system 100B includes a single 1D MEMS mirror 14 that is implemented with a gimbal frame that are used to steer or otherwise deflect light beams according to a continuous scanning pattern. It will be further elaborated below that the gimbal frame includes an outer rotationally fixed frame, an inner oscillating frame that is suspended from the outer rotationally fixed frame, and MEMS mirror 14 that is suspended from the inner oscillating frame. Both the MEMS mirror 14 and the inner oscillating frame are resonant structures that oscillate at different resonant frequencies (e.g., resonant frequencies f1 and f2) about their respective rotation axis, which are co-incident with each other.

The angular beam trajectory (i.e., the output deflection angle) produced with the two fast resonant structures (i.e., the inner oscillating frame and MEMS mirror 14) being driven at different resonant frequencies about parallel (i.e., co-incident) rotation axes comprises a slowly moving envelop oscillating at a beat frequency and fast moving oscillation trajectory under the envelope. The intervals of slow motion (along the envelop) can be used for measurements where the slow motion is required (like FMCW LIDAR).

Thus, the aforementioned beam deflection system can be realized either with separate optically coupled MEMS mirrors (FIG. 1A) or with a single MEMS mirror implemented in a gimbal frame that includes two pairs of suspension structures and two resonant frequencies but only one co-incident rotation axis (FIG. 1B). In both cases, a control loop is used to bring both resonant structure into resonance oscillating at desired amplitudes and resonant frequencies. In some cases, another control loop may be used to tune the resonant frequencies to obtain a desired frequency difference between resonant frequencies f1 and f2.

The MEMS mirrors 12 and 14 are mechanical moving mirrors (i.e., a MEMS micro-mirror) integrated on a semiconductor chip. Both MEMS mirrors 12 and 14 are suspended by a respective pair of suspension structures that are connected to a rotationally fixed frame of the semiconductor chip. The rotationally fixed frame encircles its MEMS mirror and the pair of suspension structures extend in an axial direction from the frame to the MEMS mirror. The pair of suspension structures for MEMS mirror 12 define a first resonant scanning axis 13. Similarly, the pair of suspension structures for MEMS mirror 14 define a second resonant scanning axis 15.

Thus, a MEMS mirror according to the embodiments described herein is configured to oscillate via rotation about a single resonant scanning axis (i.e., a 1D MEMS mirror). An oscillation of the MEMS mirror on a scanning axis may be done so between two predetermined extremum deflection angles (e.g., +/−15 degrees). A beam deflection device or system is configured to control the steering of the light beams in at least one dimension (e.g., in a horizontal x-direction or in a vertical y-direction).

In the example shown in FIG. 1A, two 1D MEMS mirrors 12 and 14 are used to steer light beams in one dimension. MEMS mirror 12 includes a first resonant scanning axis 13 that enables the MEMS mirror 12 to steer light according to a first deflection angle θ1. Similarly, MEMS mirror 14 includes a second resonant scanning axis 15, that extends parallel to axis 13, that enables the MEMS mirror 14 to steer light at a second deflection angle θ2, where the output deflection angle is derived from a combination of the first and second deflection angles (e.g., 2(θ1-θ2)). The oscillations at two different resonant frequencies interfere in manner that produces a beat pattern of a beat wave such that a trajectory of the output deflection angle follows the beat pattern of the beat wave. Thus, the angular rate of change of the output deflection angle depends on the beat pattern of the beat wave.

The two MEMS mirrors 12 and 14 are arranged sequentially along a transmission path of the light beams such that one of the MEMS mirrors (e.g., MEMS mirror 12) first receives a light beam and steers it according to its deflection angle θ1 and the second one of the MEMS mirrors (e.g., MEMS mirror 14) receives the light beam from the first MEMS mirror and steers it according to its deflection angle θ2 and, coincidentally, according to the output deflection angle that is modulated by the fact that the two MEMS mirrors are oscillating on parallel axes at different resonant frequencies. As a result, the two MEMS mirrors 12 and 14 operate together to steer a light beam generated by an illumination unit 10 at an output deflection angle. In this way, the two MEMS mirrors 12 and 14 can direct a light beam at a desired coordinate in the field of view.

In another example illustrated in FIG. 1B, one 1D MEMS mirror 14 implemented in a gimbal frame is used to deflect the light beam. The inner oscillating frame is configured to oscillate at the first resonant frequency f1 with respect to the outer rotationally fixed frame and the MEMS mirror 14 is configured to oscillate at the second resonant frequency f2 with respect to the inner oscillating frame. In other words, the MEMS mirror 14 is configured to oscillate about the its rotation axis 15 with respect to the outer rotationally fixed frame according a trajectory of the output deflection angle, the trajectory of which has a beat pattern of a beat wave. Said differently, the oscillations of the inner oscillating frame and MEMS mirror 14 at two different resonant frequencies interfere in manner that produces a beat pattern of a beat wave such that a trajectory of the output deflection angle follows the beat pattern of the beat wave. Thus, the angular rate of change of the output deflection angle depends on the beat pattern of the beat wave. In this way, a single MEMS mirror is able to steer a light beam received from the illumination unit 10 according to a modulated angular trajectory.

Each MEMS mirror 12, 14, and 14 is a resonator (i.e., a resonant MEMS mirror) configured to oscillate "side-to-side" about each of its scanning axes at a resonance frequency such that the light reflected from the MEMS mirror oscillates back and forth in a scanning direction of a respective scanning axis. As will be described in further detail below, different resonance frequencies may be used for each scanning axis 13 and 15 for defining the pattern.

The scanning systems 100A and 100B each includes an illumination unit 10 (i.e., a light transmitter) that includes at least one light source (e.g., at least one laser diode or light emitting diode) that is configured to transmit light beams along a transmission path towards the MEMS mirror(s). The illumination unit 10 may transmit light beams as FMCW light beams according to a trigger signal received from a system controller 23.

The scanning systems 100A and 100B also include a system controller 23 that is configured to control components of the scanning systems. In certain applications, such as LIDAR, the system controller 23 may also be configured to receive raw data from a light sensor (not illustrated) and perform processing thereon (e.g., via digital signal processing) for generating object data (e.g., point cloud data). Thus, the system controller 23 includes at least one processor and/or processor circuitry (e.g., phase detectors, comparators, ADCs, and digital signal processors (DSPs)) of a signal processing chain for processing data, as well as control circuitry, such as a microcontroller, that is configured to generate control signals.

The system controller 23 is configured to generate a trigger signal used to trigger the illumination unit 10 to generate a light beam. The system controller 23 is also configured to set a driving frequency of a resonant structure (e.g., a MEMS mirror or oscillating frame) for each of its respective scanning axis and is capable of synchronizing the oscillations about the two scanning axes 13 and 15, for example, according to a desired frequency difference.

The scanning systems 100A and 100B both include a driver 25 for driving a resonant structure (e.g., MEMS mirror 12 in FIG. 1A or the inner oscillating frame in FIG. 1B) about the first scanning axis 13 and a MEMS driver 26 for driving a MEMS mirror 14 about the second scanning axis 15. Each driver 25, 26 actuates and senses the rotation position of its resonant structure about its respective scanning axis, and provides position information (e.g., tilt angle or degree of rotation about the rotation axis) of the resonant structure to the system controller 23. Based on this position information, the system controller 23 may adjust one or more system parameters.

A drive voltage (i.e., an actuation or driving signal) is applied by a driver to an actuator structure of the resonant structure that corresponds to its corresponding scanning axis to drive the oscillation of the resonant structure about that scanning axis. The drive voltage may be referred to as a high-voltage (HV). The actuator structure may include interdigitated finger electrodes made of interdigitated mirror combs and frame combs to which a drive voltage (i.e., an actuation or driving signal) is applied by the resonant structure. The drive voltage applied to the actuator structure creates a driving force between, for example, interdigitated resonant structure combs and the frame combs, which creates a torque on the resonant structure body about the rotation axis. The drive voltage can be switched or toggled on and off (HV on/off) resulting in an oscillating driving force. The oscillating driving force causes the resonant structure to oscillate back and forth on its rotation axis between two extrema. The drive voltage may be a constant drive voltage, meaning that the drive voltage is the same voltage when actuated (i.e., toggled on). However, it will be understood that the drive voltage is being toggled on and off in order to produce the oscillation. Depending on the configuration, this actuation can be regulated or adjusted by adjusting the drive voltage off time, a voltage level of the drive voltage, or a duty cycle.

In other embodiments, an electromagnetic actuator may be used to drive a resonant structure about a corresponding scanning axis. For an electromagnetic actuator, a driving current (i.e., an actuation or driving signal) may be used to generate the oscillating driving force. Thus, it will be appreciated that drive/driving voltage and drive/driving current may be used interchangeably herein to indicate an actuation signal or a driving signal, and both may generally be referred to as a driving force.

Hence, a transmission technique includes at least two resonant structures used for transmitting a continuous wave of light into the field of view from one or two transmission mirrors according to a scanning pattern. The resonant structures continuously oscillate in resonance about each scanning axis such that the continuous wave light beam is projected into the field of view that moves across the field of view as the resonant structures change the transmission direction. Moreover, additional conditions, such as resonant frequency and frequency difference, are set by the system controller 23 in order to generate the desired scanning pattern that is a beat pattern of a beat wave.

Figure 2:
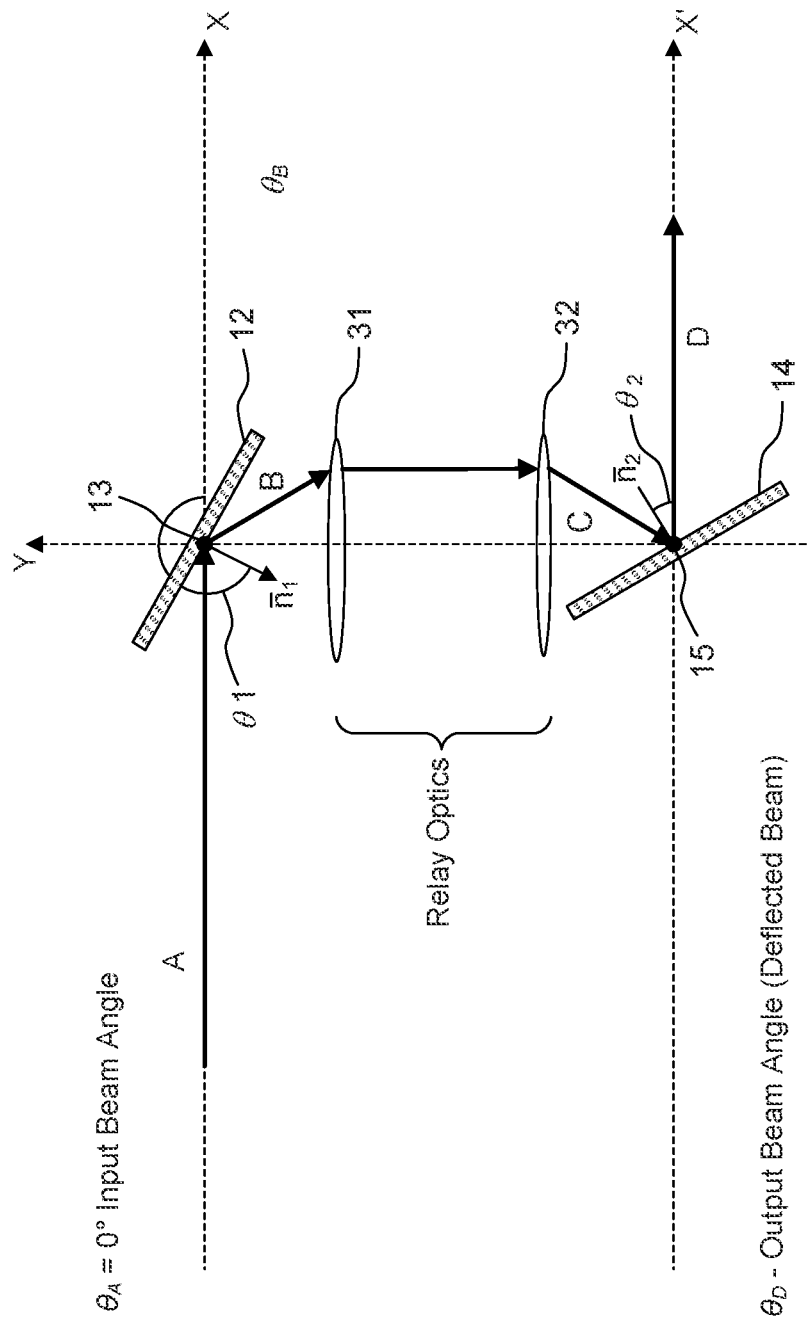
FIG. 2 shows side view of the deflection system of the resonant MEMS mirror scanning system shown in FIG. 1A according to one or more embodiments.

FIG. 2 shows side view of the deflection system of the resonant MEMS mirror scanning system 100A shown in FIG. 1A according to one or more embodiments. The deflection system receives an input light beam A (e.g., a FMCW light beam) transmitted along a first reference axis (e.g., an x-axis) and outputs an output light beam D according to an output deflection angle θout=θD having an angular trajectory that follows a beat pattern of a beat wave with respect to a second reference axis (e.g., x'-axis) that is parallel to the first reference axis. In other words, the output deflection angle θout changes with respect to the second reference axis (e.g., +/−15 degrees).

Angle θA is the input beam angle of the input light beam A relative to the x-axis. In this case, the input beam angle is set to zero.

The deflection system includes MEMS mirror 12 that receives the input light beam and deflects the light beam at a first deflection angle θB towards MEMS mirror 14. θB is an angle between beam B after being reflected by MEMS mirror 12 and the x-axis. θB is calculated according to Equations 1 and 2.

$$AOI1 = \theta1 - 180°$$ Eq. 1, $$\theta A = \theta1 + AOI1$$ Eq. 2, where AIO1 denotes a first angle of incidence (AOI) of the beam incident on MEMS mirror 12 (i.e., an angle between input beam A and normal vector n1).

MEMS mirror 14 is configured to receive the light beam from MEMS mirror 12 and deflect the light beam at a second deflection angle θD (i.e., the output deflection angle θout).

It is to be noted that the reflective surface of MEMS mirror 12 as a normal of incidence n1 from which the first deflection angle θB is calculated and the reflective surface of MEMS mirror 14 as a normal of incidence n2 from which the second deflection angle θD is calculated. The output deflection angle θout of the light beam is based on a difference between the first deflection angle and the second deflection angle (e.g., θout=2(θ1−θ2)). Specifically, the first mirror angle θ1, the second mirror angle θ2, and the output deflection angle θout are calculated according to Equations 3-7.

$$\theta1 = \theta1' + A*\sin(2\pi*f1*t),$$ Eq. 3

$$\theta2 = \theta2' + A*\sin(2\pi*f2*t),$$ Eq. 4

$$\theta_D = 2\theta2' - 2\theta1' + 180° + 2A(\sin(2\pi*f2*t) - \sin(2\pi*f1*t)),$$ Eq. 5

$$\theta1' - \theta2' = 90° \text{ to have a } 0° \text{ offset},$$ Eq. 6

$$\theta \text{out} = 4A*\sin\left(2\pi\frac{f1-f2}{2}t\right)*\cos\left(2\pi\frac{f1+f2}{2}t\right),$$ Eq. 7 where A denotes the maximum deflection angle amplitude of mirror angle θ1 and the maximum deflection amplitude of mirror angle θ2, where both have an equal maximum deflection amplitude. For example, angle amplitude A may equal 7.5°, which would provide an angular range of +/−30 degrees for the output deflection angle θout. Equation 7 defines a beat pattern of a beat wave that the output deflection angle θout follows due to axes 13 and 15 being parallel to each other and due to f1 and f2 being different. In other words, θout=θD and changes relative to the x'-axis according to the beat pattern.

θ1' is an angle between normal vector and the x-axis when MEMS mirror 12 is not moving (i.e., at rest) or is at a zero position. Similarly, θ2' is an angle between normal vector n2 and the x'-axis or to the x-axis as it is the same when the MEMS mirror 14 is not moving (i.e., at rest) or is at a zero position. It is important to note that θ1'−θ2'=90° so that 2θ2'−2θ1'+180°=0° in Equation 5. In this case, the output beam θout=θD is collinear to the input beam A when both mirrors are at 0° (e.g., when both MEMS mirrors 12 and 14 are not moving).

The deflection system also includes a relay optics system comprising two collimator lenses 31 and 32 that are sequentially arranged along the transmission path between the two MEMS mirrors 12 and 14. The relay optics system relays the light beam deflected by MEMS mirror 12 to MEMS mirror 14. Specifically, lens 31 has rotation axis 13 of mirror 12 in its focal plane receives the deflected light beam B from MEMS mirror 12 and directs the light beam as a collimated light beam to lens 32. In this way, the two MEMS mirrors 12 and 14 are optically coupled to each other via the relay optics system, meaning they receive and deflect the same light beam even though they are mechanically separated. Lens 32 having rotation axis 15 of the mirror 14 in its focal plane then directs the light beam C at MEMS mirror 14 at angle θC. The MEMS mirror 12, the relay optics system, and the MEMS mirror 14 are arranged sequentially along a transmission path of the light beam.

θC is an angle between beam C after propagating relay optics (i.e., after lens 32) and the x-axis. θC is calculated according to Equation 8.

$$\theta C = 360° - \theta B + 180° \qquad \text{Eq. 8.}$$

θD is an angle between the output beam D and the x'-axis or x-axis. θD can be calculated according to Equations 9 and 10.

$$AOI2 = \theta C - 180° - \theta 2, \qquad \text{Eq. 9,}$$

$$\theta D = \theta 2 - AOI2 \qquad \text{Eq. 10,}$$

where AOI2 is a second angle of incidence of beam C incident on MEMS mirror 14 (i.e., an angle between beam C and normal vector n2).

Figure 3A:
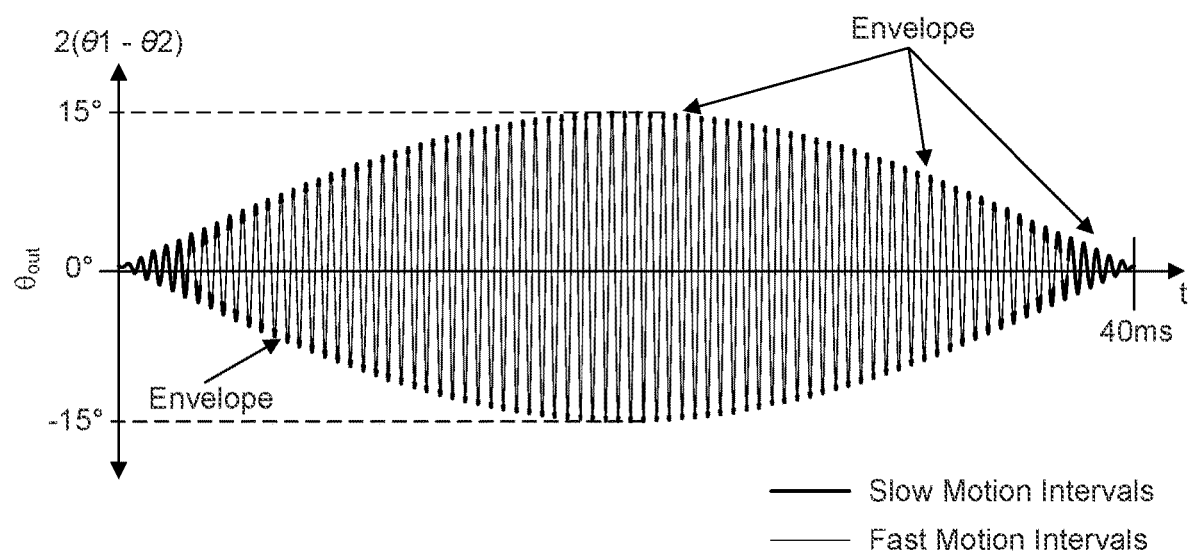
FIG. 3A illustrates a portion of an angular trajectory of an output deflection angle θout according to one or more embodiments.

FIG. 3A illustrates a portion of an angular trajectory of an output deflection angle θout according to one or more embodiments. The oscillations of the MEMS mirrors 12 and 14 at their respective resonance frequencies interfere with one another according to Equation 3 to produce a beat wave having a beat pattern (i.e., an interference pattern). The beat wave has two period oscillations: one is a slowly moving envelop oscillating at the beat frequency and the other is fast moving oscillating trajectory under the envelope (i.e., confined within the envelope).

Slow motion intervals are produced along the envelop and can be used for measurements where slow mirror motion is required. For example, the angular velocity or rate of change of the output deflection angle θout is greatest when a resonant structure is crossing its zero deflection angle and is least when the output deflection angle θout is changing directions at its extrema or peak amplitudes. The zero deflection angle is the angular position the mirror would naturally come to a rest if not being driven. Therefore, the angular velocity slows in an angular region near each peak of the angular trajectory of the output deflection angle θout (i.e., near each peak of the beat wave). It is in this region that slow motion measurements can be used.

As shown in FIG. 3A, the output deflection angle θout of the light beam oscillates according to a beat pattern of a beat wave whose extrema amplitudes are modulated and defined by a periodic envelope. The periodic envelope is a sinusoidal wave whose frequency is referred to as a beat frequency. The periodic envelope defines the "shape" or "outline" of the beat wave. The extrema amplitudes extend to the boundaries of this envelope and are thereby bound by the sinusoidal envelop. The periodic envelope is defined by the sinusoidal term of Equation 3. Thus, the beat frequency is defined by the predetermined frequency difference (f1−f2) divided by two.

While the extrema amplitudes of the output deflection angle θout are modulated by the periodic envelope over time, the output deflection angle θout has an oscillation frequency inside the envelope that is defined by the cosinusoidal term of Equation 3. Thus, oscillation frequency of the output deflection angle θout is defined by an average of the first resonant frequency and the second resonant frequency (i.e., f1+f2 divided by two).

To summarize, the output deflection angle θout moves according to a beat pattern of a beat wave whose extrema amplitudes are modulated and defined by a periodic envelope, where the periodic envelope has a beat frequency that is defined by the predetermined frequency difference and the beat wave has an oscillation frequency defined by an average of the first resonant frequency and the second resonant frequency.

Since the predetermined frequency difference between f1 and f2 defines the beat frequency, it is also responsible for defining the shape of the periodic envelope. Specifically, the beat frequency is related a slope of the periodic envelop, including the maximum slope of the periodic envelope. The system controller 23 is configured to control the drivers 25 and 26 in order to control the predetermined frequency difference (f1−f2) such that the maximum slope of the periodic envelope is maintained below a predetermined threshold over an entire scanning period during which the light beam is deflected over a full angular range of the output deflection angle. In this way, it can be ensured that slow motion intervals are produced along the envelop at every angle during the entire scanning period.

As noted above, slow motion intervals occur in a region near each oscillation peak of the beat wave. This is where the output deflection angle θout is slowed for a direction change (i.e., a change from left-to-right or from right-to-left). Each slow motion interval occurs for only a portion in angular space. In other words, each slow motion interval covers a respective angular range that depends on the beat frequency. As the output deflection angle θout approaches an extremum amplitude, it begins to slow. At a certain deflection angle, the angular velocity of the output deflection angle θout falls below a predetermined velocity threshold that defines "slow motion" that may be limit for certain slow motion measurements. The slow motion interval continues as the output deflection angle θout passes the extremum amplitude, at which time the angular velocity of the output deflection angle θout starts to increase. The slow motion interval ends when the angular velocity once again meets or exceeds the predetermined velocity threshold.

In FIG. 3A, the "tips" of the beat pattern are marked at slow region intervals and these slow region intervals follow along the periodic envelope. Because the extrema amplitude of the output deflection angle θout are modulated by the periodic envelope, each oscillation covers a different angular range at which its slow motion interval occurs. The system controller 23 is configured to control the drivers 25 and 26 in order to control the predetermined frequency difference such that the beat pattern of the beat wave has slow motion intervals along the entire trajectory of the periodic envelope, where the slow motion intervals are segments of the beat wave where an angular rate of change of the output deflection angle θout is less than a predefined velocity threshold.

Figure 3B:
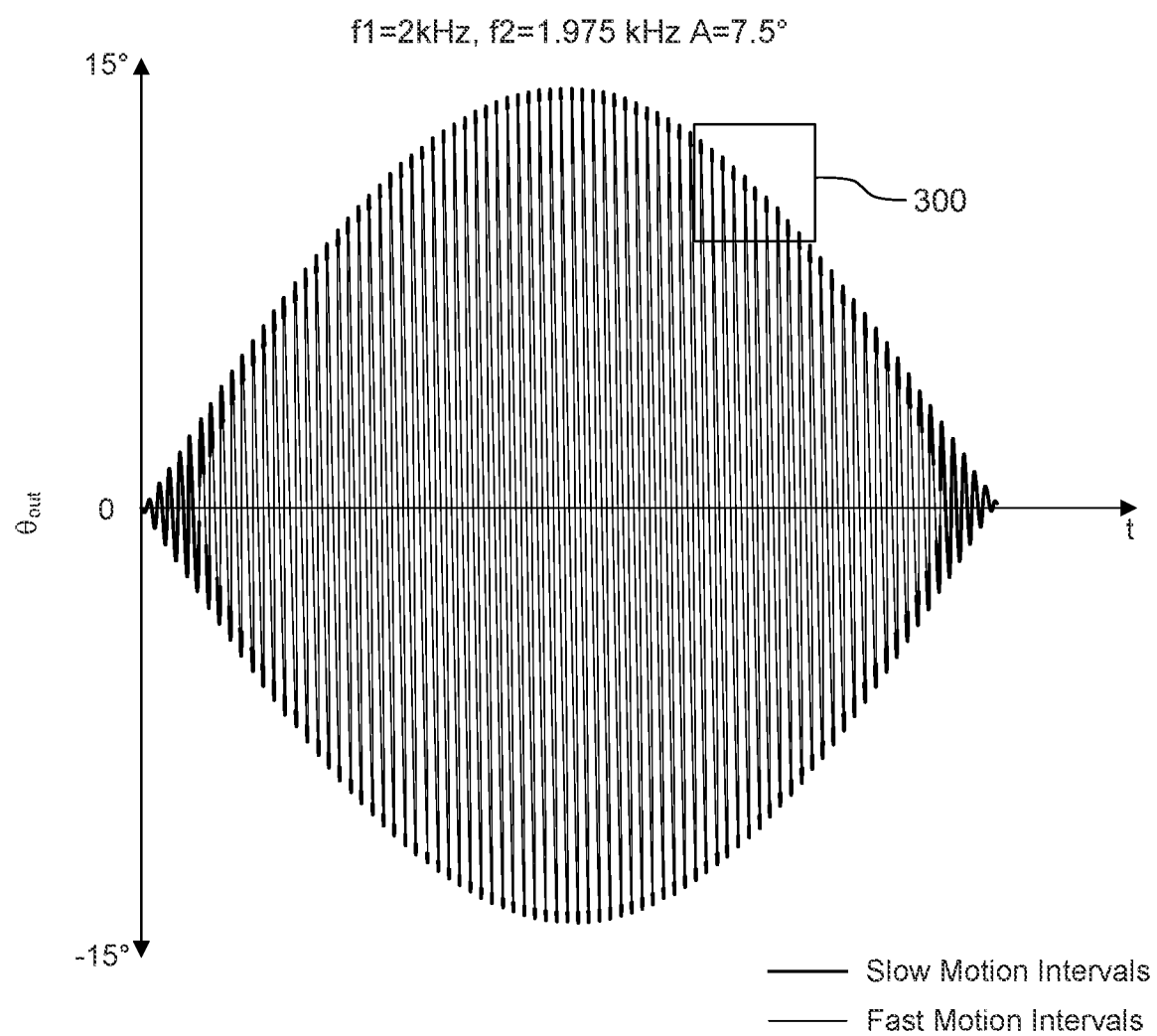
FIG. 3B illustrates a portion of an angular trajectory of an output deflection angle θout with the first resonant frequency f1 set to 2 kHz, the second resonant frequency f2 set to 1.975 kHz, and angle amplitude A set to 7.5°, as only one possible example.

FIG. 3B illustrates a portion of an angular trajectory of an output deflection angle θout with the first resonant frequency f1 set to 2 kHz, the second resonant frequency f2 set to 1.975 kHz, and angle amplitude A set to 7.5°, as only one possible example.

Figure 3C:
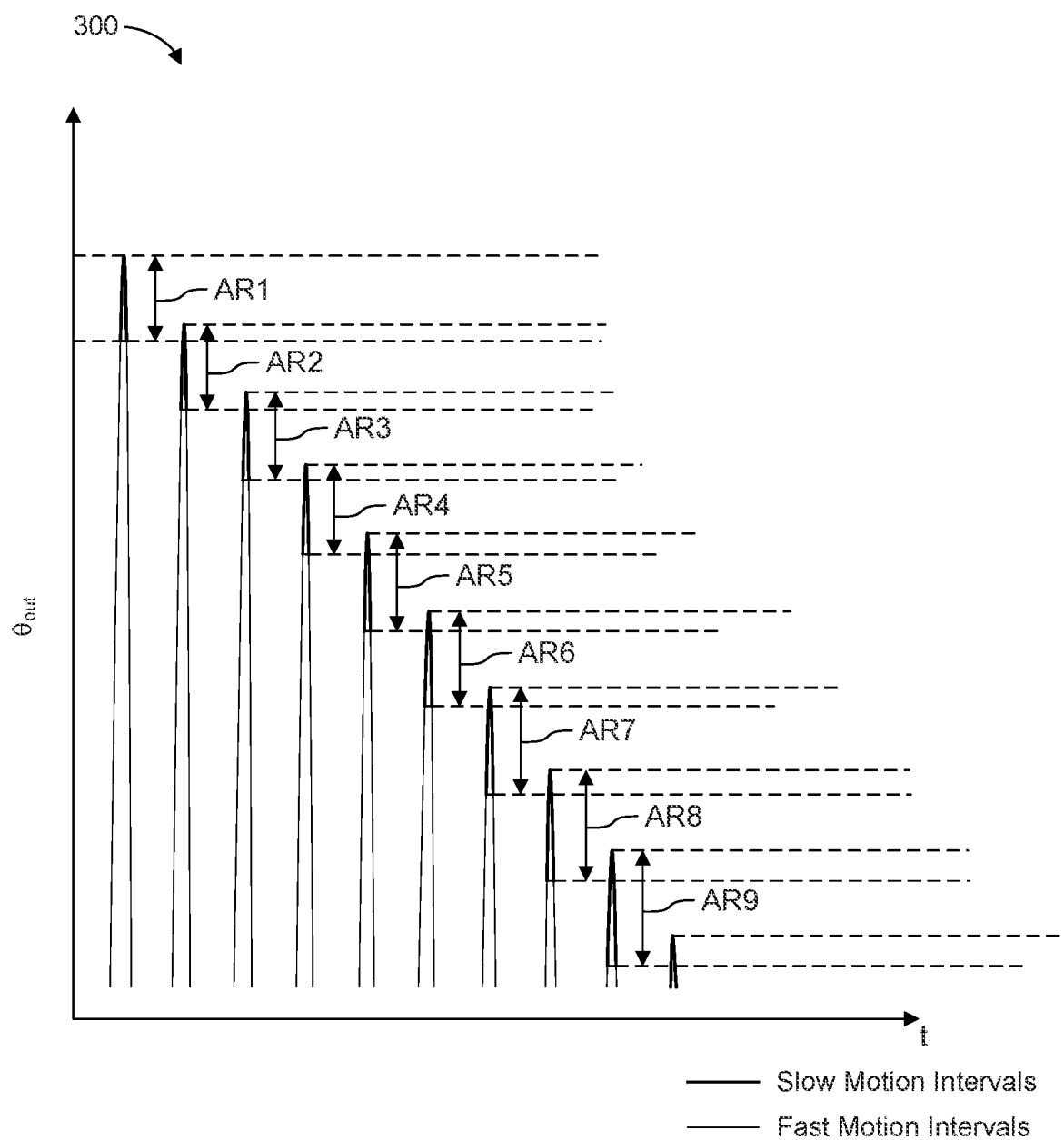
FIG. 3C illustrates a zoomed-in portion of the beat wave shown in FIG. 3B.

FIG. 3C illustrates a zoomed-in portion 300 of the beat wave shown in FIG. 3B. Each of the slow motion intervals are defined by a respective angular range and a respective temporal range. As can be seen, the left-most oscillation peak of output deflection angle θout has a slow motion interval that covers an angular rage AR1 in angular space. The next adjacent oscillation peak has a slow motion interval that covers a different angular rage AR2 that is at least contiguous with angular rage AR1. In this case, angular rage AR2 is overlapping with angular rage AR1. In this way, all angular values in angular ranges AR1 and AR2 along the trajectory of the periodic envelope have a slow motion portion during which slow motion measurements can be taken.

Similarly, the next adjacent oscillation peak has a slow motion interval that covers a different angular rage AR3 that is at least contiguous with angular rage AR2. The next adjacent oscillation peak has a slow motion interval that covers a different angular rage AR4 that is at least contiguous with angular rage AR3. The next adjacent oscillation peak has a slow motion interval that covers a different angular rage AR5 that is at least contiguous with angular rage AR4. The next adjacent oscillation peak has a slow motion interval that covers a different angular rage AR6 that is at least contiguous with angular rage AR5. The next adjacent oscillation peak has a slow motion interval that covers a different angular rage AR7 that is at least contiguous with angular rage AR6. The next adjacent oscillation peak has a slow motion interval that covers a different angular rage AR8 that is at least contiguous with angular rage AR7. Finally, the next adjacent oscillation peak has a slow motion interval that covers a different angular rage AR9 that is at least contiguous with angular rage AR8.

This pattern of contiguous or overlapping slow motion angular ranges continue along the upper extrema of the upper (positive) portion of the periodic envelope as well as for the lower extrema of the lower (negative) portion of the periodic envelope. As a result, all angular values in entire angular range output deflection angle θout (e.g., all angular values between +/−15 degrees) have a slow motion portion during which slow motion measurements can be taken. Said differently, the periodic envelope has a maximum peak that defines an absolute maximum output deflection angle of the light beam and the periodic envelope has a minimum peak that defines an absolute minimum output deflection angle of the light beam, the maximum output deflection angle and the minimum output deflection angle define a full angular range of the output deflection angle of the light beam, and over a trajectory of the beat wave, the slow motion intervals overlap in angular space such that the slow motion intervals, when taken as a whole, coincide with all deflection angles of the full angular range of the output deflection angle θout.

Those slow motion intervals with positive angular values may be referred to as a first plurality of slow motion intervals, while those slow motion intervals with negative angular values may be referred to as a second plurality of slow motion intervals. Each of the first plurality of slow motion intervals encompass a different one of the plurality of maxima of the beat wave, where adjacent slow motion intervals of the first plurality of slow motion intervals have different respective angular ranges that overlap, and each of the second plurality of slow motion intervals encompass a different one of the plurality of minima of the beat wave, where adjacent slow motion intervals of the second plurality of slow motion intervals have different respective angular ranges that overlap.

In contrast with oscillation waveform whose extrema amplitude are constant and therefore not modulated with a periodic envelope, it would only be possible to have slow motion intervals near, for example, 15 degrees and −15 degrees (i.e., near the absolute maxima and minima). The vast majority of the oscillation waveform (e.g., +/−14.5 degrees) would be too fast for slow motion measurements unless the oscillation of the output deflection angle is drastically slowed by using a low resonant frequency. Even then, not all output deflection angles may coincide with slow motion. However, as noted above, the mirror oscillation is then vulnerable to vibrations and further results is low resolution.

Figure 4A:
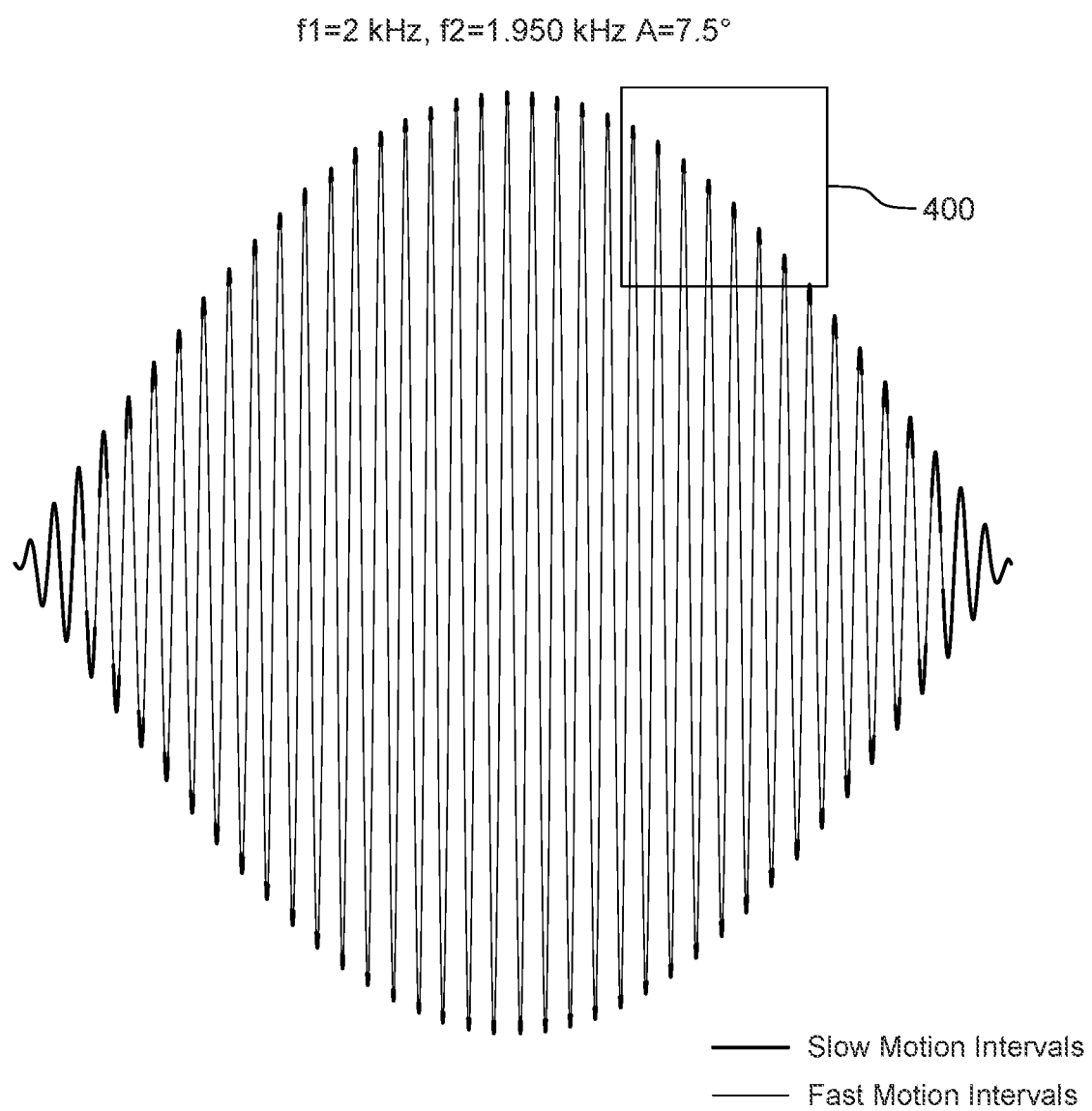
FIG. 4A illustrates a portion of an angular trajectory of an output deflection angle θout with the first resonant frequency f1 set to 2 kHz, the second resonant frequency f2 set to 1.950 kHz, and angle amplitude A set to 7.5°, as only one possible example.

FIG. 4A illustrates a portion of an angular trajectory of an output deflection angle θout with the first resonant frequency f1 set to 2 kHz, the second resonant frequency f2 set to 1.950 kHz, and angle amplitude A set to 7.5°, as only one possible example.

Figure 4B:
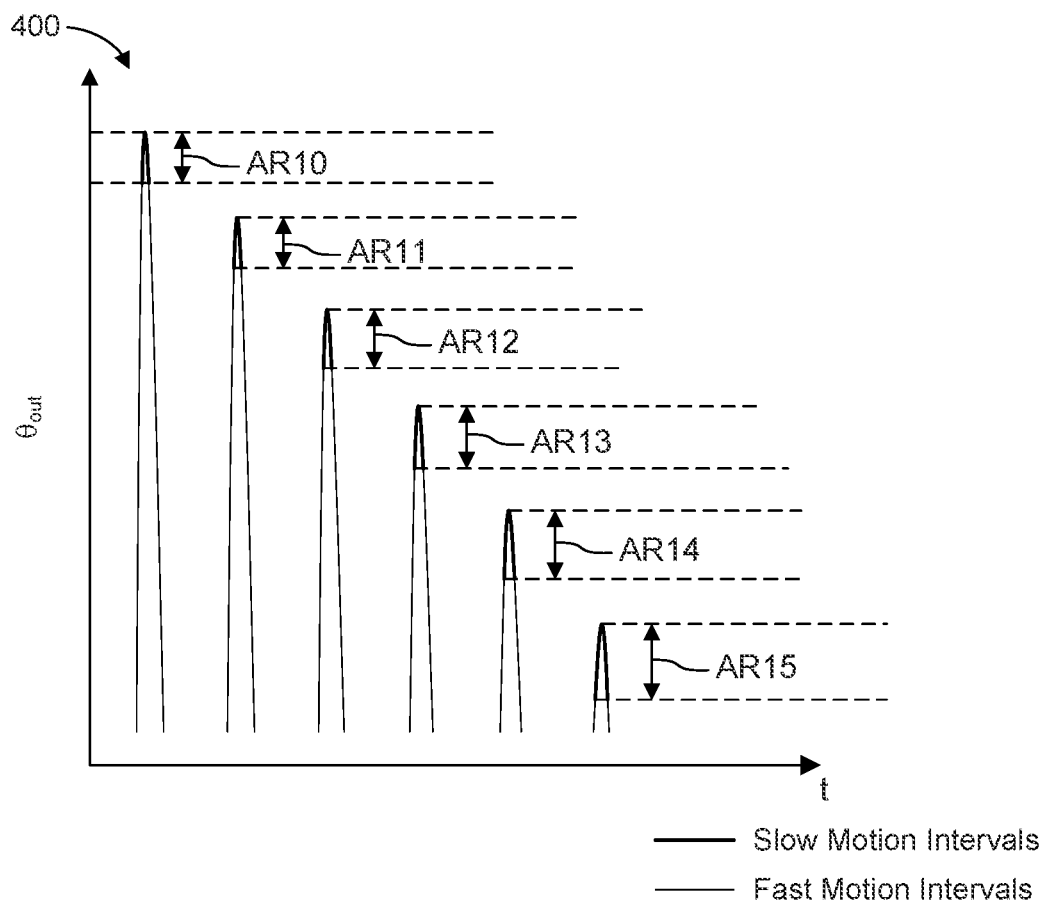
FIG. 4B illustrates a zoomed-in portion of the beat wave shown in FIG. 4A.

FIG. 4B illustrates a zoomed-in portion 400 of the beat wave shown in FIG. 4A. Each of the slow motion intervals are defined by a respective angular range AR10-AR15 and a respective temporal range. However, in contrast to the angular ranges AR1-AR9 shown in FIG. 3C, the angular ranges AR10-AR15 of adjacent oscillation peaks do not overlap. In this case, there are angular ranges during the trajectory of the output deflection angle θout that cannot be used for slow motion. This would result some angular regions in the field of view where slow motion measurements are not available, leading to "blind spots" or voids for slow motion applications. Thus, the system controller 23 is configured to control the drivers 25 and 26 in order to control the predetermined frequency difference such that the beat pattern of the beat wave has slow motion intervals along the entire trajectory of the periodic envelope and additionally such that slow motion intervals that are adjacent along the trajectory of the periodic envelope have angular ranges that are contiguous or overlap such that all angular values of the entire angular range of the output deflection angle θout have a slow motion interval corresponding thereto.

Figure 5:
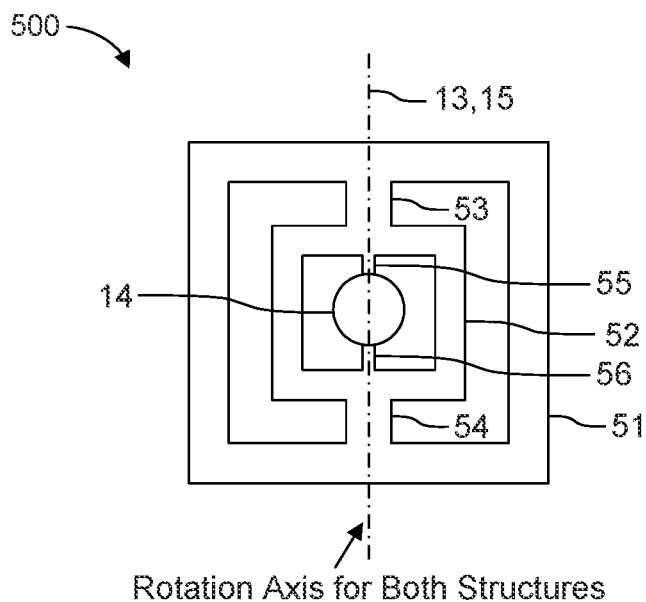
FIG. 5 illustrates a MEMS scanning device according to one or more embodiments.

FIG. 5 illustrates a MEMS scanning device 500 according to one or more embodiments. In particular, the MEMS scanning device 500 is a 1D MEMS mirror 14 implemented in a gimbal frame, as similarly shown in FIG. 1B. The gimble frame includes an outer rotationally fixed frame 51 that does not rotate or oscillate about an axis, an inner oscillating frame 52 that is suspended from the outer rotationally fixed frame by a pair of suspension structures 53 and 54, and a resonant MEMS mirror 14 that is suspended from the inner oscillating frame 52 by a pair of suspension structures 55 and 56. Additionally, the first rotation axis 13 is co-incident with the second rotation axis 15 and the two rotation axes may be considered as the same, common rotation axis.

The inner oscillating frame 52 is a resonant structure configured to oscillate about the first rotation axis 13 at first resonant frequency f1 relative to the outer rotationally fixed frame 51. Additionally, the MEMS mirror 14 is configured to oscillate about the second rotation axis 15 at second resonant frequency f2 relative to the inner oscillating frame 52. Moreover, the MEMS mirror 14 is configured to oscillate about the second rotation axis 15 with respect to the outer rotationally fixed frame 51 according to the beat pattern of the beat wave. In other words, the oscillation trajectory of the output deflection angle θout follows the beat patterns of the beat wave.

The first pair of suspension structures 53 and 54 extend along the first rotation axis 13 and mechanically couple the inner oscillating frame 52 to the outer rotationally fixed frame 51. The second pair of suspension structures 55 and 56 extend along the second rotation axis 15 and mechanically couple the resonant mirror to the inner oscillating frame. The suspension structures behave like torsion springs that twist about their rotations axes as their respective resonant structures oscillate.

The entire device 500 may be made as a single, one-piece integral structure from semiconductor material. The outer rotationally fixed frame 51 encircles the inner oscillating frame 52, and the inner oscillating frame 52, coupled between the outer rotationally fixed frame 51 and the MEMS mirror 14, encircles the MEMS mirror 14.

As before, the first resonant frequency f1 and the second resonant frequency f2 are different and define a predetermined frequency difference. As a result, the output deflection angle of the light beam oscillates according to a beat pattern of a beat wave whose extrema amplitudes are modulated and defined by a periodic envelope, similar to that shown in FIGS. 3A-3C.

Additional example embodiments are set forth below.

1. A light beam deflection system configured to transmit a light beam at an output deflection angle that changes over time, the light beam deflection system comprising:
   a first resonant structure configured to rotate about a first rotation axis;
   a second resonant structure configured to rotate about a second rotation axis, wherein the first rotation axis is parallel to the second rotation axis; and
   a driver circuit configured to produce the output deflection angle by generating a first driving signal at a first resonant frequency to continuously drive the first resonant structure about the first rotation axis while further generating a second driving signal at a second resonant frequency to continuously drive the second resonant structure about the second rotation axis such that first and the second resonant frequencies interfere to produce a beat wave,
   wherein the output deflection angle of the light beam oscillates according to a beat pattern of the beat wave whose extrema amplitudes are modulated and defined by a periodic envelope,
   wherein the first resonant frequency and the second resonant frequency are different and define a predetermined frequency difference.

2. The light beam deflection system of embodiment 1, wherein:
   the first and the second resonant structures are optically coupled, and
   the first resonant structure is configured to oscillate about the first rotation axis at the first resonant frequency while the second resonant structure oscillates about the second rotation axis at the second resonant frequency such that the output deflection angle changes over time according to the beat pattern of the beat wave.

3. The light beam deflection system of embodiment 2, wherein the first resonant structure and the second resonant structure are microelectromechanical system (MEMS) mirrors.

4. The light beam deflection system of embodiment 1, wherein the second resonant structure is configured to deflect the light beam at the output deflection angle, wherein the output deflection angle changes over time according to the beat pattern of the beat wave.

5. The light beam deflection system of embodiment 1, wherein:
   the first and the second resonant structures are mechanically coupled to each other with the first rotation axis being co-incident with the second rotation axis, and
   the first resonant structure is configured to oscillate about the first rotation axis at the first resonant frequency while the second resonant structure oscillates about the second rotation axis at the second resonant frequency such that the output deflection angle changes over time according to the beat pattern of the beat wave.

6. The light beam deflection system of embodiment 5, further comprising:
   a microelectromechanical system (MEMS) device comprising an outer rotationally fixed frame, an inner oscillating frame that is suspended from the outer rotationally fixed frame, and the second resonant structure that is suspended from the inner oscillating frame,
   wherein the inner oscillating frame is the first resonant structure, and
   wherein the second resonant structure is a MEMS mirror.

7. The light beam deflection system of embodiment 6, wherein:
   the outer rotationally fixed frame encircles the inner oscillating frame, and
   the inner oscillating frame, coupled between the outer rotationally fixed frame and the second resonant structure, encircles the second resonant structure.

8. The light beam deflection system of embodiment 1, wherein the periodic envelope has a beat frequency that is defined by the predetermined frequency difference and the beat wave has an oscillation frequency defined by an average of the first resonant frequency and the second resonant frequency.

Although embodiments described herein relate to MEMS devices with at least one MEMS mirror, it is to be understood that other implementations may include optical devices other than MEMS mirror devices, including other non-MEMS resonant oscillating structures that are used to steer light according to a scanning pattern. In addition, although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer, or an electronic circuit. In some embodiments, some one or more of the method steps may be executed by such an apparatus.

It is further to be noted that methods disclosed in the specification or in the claims may be implemented by a device having means for performing each of the respective acts of these methods. Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application-specific integrated circuits (ASICs), field programmable logic arrays (FPGAs), programmable logic controller (PLC), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure. A control unit may use electrical signals and digital algorithms to perform its receptive, analytic, and control functions, which may further include corrective functions. Such hardware, software, and firmware may be implemented within the same device or within separate devices to support the various techniques described in this disclosure.

One or more aspects of the present disclosure may be implemented as a non-transitory computer-readable recording medium having recorded thereon a program embodying methods/algorithms for instructing the processor to perform the methods/algorithms. Thus, a non-transitory computer-readable recording medium may have electronically readable control signals stored thereon, which cooperate (or are capable of cooperating) with a programmable computer system such that the respective methods/algorithms are performed. The non-transitory computer-readable recording medium can be, for example, a CD-ROM, DVD, Blu-ray disc, a RAM, a ROM, a PROM, an EPROM, an EEPROM, a FLASH memory, or an electronic memory device.

Although various embodiments have been disclosed, it will be apparent to those skilled in the art that various changes and modifications can be made which will achieve some of the advantages of the concepts disclosed herein without departing from the spirit and scope of the invention. It will be obvious to those reasonably skilled in the art that other components performing the same functions may be suitably substituted. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

What is claimed is:

1. A light beam deflection system configured to transmit a light beam at an output deflection angle that changes over time, the light beam deflection system comprising:
    a first resonant structure configured to oscillate about a first rotation axis at a first resonant frequency;
    a second resonant structure configured to oscillate about a second rotation axis at a second resonant frequency;
    wherein the first rotation axis is parallel to the second rotation axis,
        wherein the first resonant frequency and the second resonant frequency are different and define a predetermined frequency difference; and
    a driver circuit configured to generate a first driving signal to drive the first resonant structure about the first rotation axis at the first resonant frequency while further generating a second driving signal to drive the second resonant structure about the second rotation axis at the second resonant frequency such that the output deflection angle of the light beam oscillates according to a beat pattern of a beat wave whose extrema amplitudes are modulated and defined by a periodic envelope.

2. The light beam deflection system of claim 1, wherein the periodic envelope has a beat frequency that is defined by the predetermined frequency difference and the beat wave has an oscillation frequency defined by an average of the first resonant frequency and the second resonant frequency.

3. The light beam deflection system of claim 2, wherein the output deflection angle of the light beam oscillates at the oscillation frequency of the beat wave.

4. The light beam deflection system of claim 1, wherein the beat pattern is an interference pattern of the first resonant frequency and the second resonant frequency.

5. The light beam deflection system of claim 1, wherein the first and the second resonant structures are optically coupled.

6. The light beam deflection system of claim 5, wherein:
    the first and the second resonant structures are arranged sequentially along a transmission path of the light beam, and
    the first resonant structure and the second resonant structure are optically coupled such that the first resonant structure is configured to receive the light beam and deflect the light beam at a first deflection angle towards the second resonant structure, and the second resonant structure is configured to receive the light beam from the first resonant structure and deflect the light beam at a second deflection angle.

7. The light beam deflection system of claim 6, wherein the output deflection angle of the light beam is based on a difference between the first deflection angle and the second deflection angle.

8. The light beam deflection system of claim 7, wherein the output deflection angle of the light beam oscillates at an average of the first resonant frequency and the second resonant frequency.

9. The light beam deflection system of claim 6, further comprising:
    a relay optics system arranged between the first and the second resonant structures, wherein the relay optics system relays the light beam deflected by the first resonant structure to the second resonant structure.

10. The light beam deflection system of claim 6, further comprising:
    a transmitter configured to transmit the light beam along the transmission path to be received and sequentially deflected by the first and the second resonant structures.

11. The light beam deflection system of claim 1, wherein the first resonant structure and the second resonant structure are microelectromechanical system (MEMS) mirrors.

12. The light beam deflection system of claim 1, wherein the light beam is a frequency-modulated continuous-wave (FMCW).

13. The light beam deflection system of claim 1, wherein the driver circuit is configured to control the predetermined frequency difference such that the beat pattern of the beat wave has slow motion intervals along a trajectory of the periodic envelope, wherein the slow motion intervals are segments of the beat wave where an angular rate of change of the output deflection angle is less than a predefined threshold.

14. The light beam deflection system of claim 13, wherein:
    the periodic envelope has a maximum peak that defines an absolute maximum output deflection angle of the light beam and the periodic envelope has a minimum peak that defines an absolute minimum output deflection angle of the light beam,
    the absolute maximum output deflection angle and the absolute minimum output deflection angle define a full angular range of the output deflection angle of the light beam, and
    over a trajectory of the beat wave, the slow motion intervals overlap in angular space such that the slow motion intervals, when taken as a whole, coincide with all deflection angles of the full angular range of the output deflection angle.

15. The light beam deflection system of claim 13, wherein:
each of the slow motion intervals is defined by a respective angular range and a respective temporal range, and
the respective angular ranges of the slow motion intervals are contiguous or overlapping along the trajectory of the periodic envelope.

16. The light beam deflection system of claim 13, wherein:
each of the slow motion intervals is defined by a respective angular range and a respective temporal range,
the beat wave has a plurality of maxima whose amplitudes are defined by the periodic envelope and a plurality of minima whose amplitudes are defined by the periodic envelope,
the slow motion intervals include a first plurality of slow motion intervals and a second plurality of slow motion intervals,
each of the first plurality of slow motion intervals encompasses a different one of the plurality of maxima of the beat wave, wherein adjacent slow motion intervals of the first plurality of slow motion intervals have different respective angular ranges that overlap, and
each of the second plurality of slow motion intervals encompasses a different one of the plurality of minima of the beat wave, wherein adjacent slow motion intervals of the second plurality of slow motion intervals have different respective angular ranges that overlap.

17. The light beam deflection system of claim 1, wherein the driver circuit is configured to control the predetermined frequency difference such that a maximum slope of the periodic envelope is maintained below a predetermined threshold over an entire scanning period during which the light beam is deflected over a full angular range of the output deflection angle.

18. The light beam deflection system of claim 17, wherein:
the driver circuit is configured to control the predetermined frequency difference such that the beat pattern of the beat wave has slow motion intervals along a trajectory of the periodic envelope, wherein the slow motion intervals are segments of the beat wave where an angular rate of change of the output deflection angle is less than a predefined threshold, and
over a trajectory of the beat wave, the slow motion intervals overlap in angular space such that the slow motion intervals, when taken as a whole, coincide with all deflection angles of the full angular range of the output deflection angle.

19. The light beam deflection system of claim 1, wherein the first and the second resonant structures are mechanically coupled.

20. The light beam deflection system of claim 19, further comprising:
a microelectromechanical system (MEMS) device comprising an outer rotationally fixed frame, an inner oscillating frame that is suspended from the outer rotationally fixed frame, and the second resonant structure that is suspended from the inner oscillating frame,
wherein the inner oscillating frame is the first resonant structure,
wherein the second resonant structure is a MEMS mirror, and
wherein the first rotation axis is co-incident with the second rotation axis.

21. The light beam deflection system of claim 20, wherein:
the MEMS device comprises a gimbal frame that comprises the outer rotationally fixed frame and the inner oscillating frame,
the outer rotationally fixed frame encircles the inner oscillating frame, and
the inner oscillating frame, coupled between the outer rotationally fixed frame and the second resonant structure, encircles the second resonant structure.

22. The light beam deflection system of claim 20, wherein the inner oscillating frame is configured to oscillate at the first resonant frequency with respect to the outer rotationally fixed frame and the second resonant structure is configured to oscillate at the second resonant frequency with respect to the inner oscillating frame.

23. The light beam deflection system of claim 22, wherein the second resonant structure is configured to oscillate about the second rotation axis with respect to the outer rotationally fixed frame according to the beat pattern of the beat wave.

24. A light beam deflection system configured to transmit a light beam at an output deflection angle that changes over time, the light beam deflection system comprising:
a microelectromechanical system (MEMS) device comprising:
an outer rotationally fixed frame;
an inner oscillating frame that is suspended from the outer rotationally fixed frame, wherein the inner oscillating frame is a resonant structure configured to oscillate about a first rotation axis at a first resonant frequency relative to the outer rotationally fixed frame; and
a resonant mirror that is suspended from the inner oscillating frame, wherein the resonant mirror is configured to oscillate about a second rotation axis at second resonant frequency relative to the inner oscillating frame,
wherein the first rotation axis is co-incident with the second rotation axis,
wherein the first resonant frequency and the second resonant frequency are different and define a predetermined frequency difference; and
a driver circuit configured to generate a first driving signal to drive the inner oscillating frame about the first rotation axis at the first resonant frequency while further generating a second driving signal to drive the resonant mirror about the second rotation axis at the second resonant frequency such that the output deflection angle of the light beam oscillates according to a beat pattern of a beat wave whose extrema amplitudes are modulated and defined by a periodic envelope.

25. The light beam deflection system of claim 24, wherein the resonant mirror is configured to deflect the light beam at the output deflection angle, wherein the output deflection angle changes over time according to the beat pattern of the beat wave.

26. The light beam deflection system of claim 25, wherein the periodic envelope has a beat frequency that is defined by the predetermined frequency difference and the beat wave has an oscillation frequency defined by an average of the first resonant frequency and the second resonant frequency.

27. The light beam deflection system of claim 24, wherein the MEMS device further comprises:
a first pair of suspension structures that extend along the first rotation axis, wherein the first pair of suspension structures mechanically couple the inner oscillating frame to the outer rotationally fixed frame; and
a second pair of suspension structures that extend along the second rotation axis, wherein the second pair of suspension structures mechanically couple the resonant mirror to the inner oscillating frame.

28. The light beam deflection system of claim 24, wherein the MEMS device comprises a gimbal frame that comprises the outer rotationally fixed frame and the inner oscillating frame,
wherein the outer rotationally fixed frame encircles the inner oscillating frame, and
wherein the inner oscillating frame, coupled between the outer rotationally fixed frame and the resonant mirror, encircles the resonant mirror.

29. The light beam deflection system of claim 24, wherein the resonant mirror is configured to oscillate about the second rotation axis with respect to the outer rotationally fixed frame according to the beat pattern of the beat wave.

30. A method of deflecting a light beam at an output deflection angle that changes over time, the method comprising:
driving a first oscillator structure to oscillate about a first rotation axis at a first resonance frequency according to a first driving signal;
while driving the first oscillator structure at the first resonance frequency, driving a second oscillator structure to oscillate about a second rotation axis at a second resonance frequency according to a second driving signal, wherein the first rotation axis is parallel to the second rotation axis;
controlling the first driving signal and the second driving signal such that the first resonant frequency and the second resonant frequency are different and have a predetermined frequency difference therebetween; and
transmitting the light beam to be deflected by at least the second oscillator structure such that the output deflection angle of the light beam oscillates according to a beat pattern of a beat wave whose extrema amplitudes are modulated and defined by a periodic envelope.

31. The method of claim 30, wherein an oscillation of the first oscillator structure interferes with the oscillation of the second oscillator structure to produce the beat wave that modulates the output deflection angle of the light beam.

* * * * *